US008835298B2

(12) United States Patent
Kumarasamy et al.

(10) Patent No.: US 8,835,298 B2
(45) Date of Patent: Sep. 16, 2014

(54) NISI REWORK PROCEDURE TO REMOVE PLATINUM RESIDUALS

(75) Inventors: Sivakumar Kumarasamy, Dresden (DE); Clemens Fitz, Dresden (DE); Markus Lenski, Dresden (DE); Jochen Poth, Dresden (DE); Kristin Schupke, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 274 days.

(21) Appl. No.: 13/415,492

(22) Filed: Mar. 8, 2012

(65) Prior Publication Data
US 2013/0234213 A1 Sep. 12, 2013

(51) Int. Cl.
*H01L 21/3205* (2006.01)
*H01L 21/4763* (2006.01)

(52) U.S. Cl.
USPC ............. 438/595; 257/213; 257/E21.158; 257/E29.242; 438/591

(58) Field of Classification Search
None
See application file for complete search history.

(56) References Cited

U.S. PATENT DOCUMENTS

2009/0127594 A1* 5/2009 Arunachalam et al. ....... 257/288
2012/0248551 A1* 10/2012 Baars et al. ................... 257/412

* cited by examiner

*Primary Examiner* — Sonya D McCall Shepard
(74) *Attorney, Agent, or Firm* — Ditthavong & Steiner, P.C.

(57) ABSTRACT

The amount of Pt residues remaining after forming Pt-containing NiSi is reduced by performing a rework including applying SPM at a temperature of 130° C. in a SWC tool, if Pt residue is detected. Embodiments include depositing a layer of Ni/Pt on a semiconductor substrate, annealing the deposited Ni/Pt layer, removing unreacted Ni from the annealed Ni/Pt layer, annealing the Ni removed Ni/Pt layer, removing unreacted Pt from the annealed Ni removed Ni/Pt layer, analyzing the Pt removed Ni/Pt layer for unreacted Pt residue, and if unreacted Pt residue is detected, applying SPM to the Pt removed Ni/Pt layer in a SWC tool. The SPM may be applied to the Pt removed Ni'/Pt layer at a temperature of 130° C.

20 Claims, 4 Drawing Sheets

NISI REWORK PROCEDURE TO REMOVE PLATINUM RESIDUALS

TECHNICAL FIELD

The present disclosure relates to semiconductor silicidation with reduced platinum (Pt) residues. The present disclosure is particularly applicable to 32 nanometer (nm) technology nodes and beyond.

BACKGROUND

Conventional silicidation techniques employ nickel (Ni)/Pt as a sputter target. The Pt serves as a nickel silicide (NiSi) stabilizer and as an etch stop for a subsequent contact etch. After the NiSi formation sequence of sputtering Ni/Pt and performing a first rapid thermal anneal (RTA), a sulfuric acid-hydrogen peroxide mixture (SPM) is applied to wet strip unreacted Ni. Since SPM fails to strip unreacted Pt, after a second RTA, concentrated Aqua Regia (1:4) (nitric acid ($HNO_3$) plus hydrochloric acid (4HCl)) is employed to strip the unreacted Pt. The HCl yields chloride ions which react with Pt according to formula I to form chloroplatinate ion ($PtCl_6$), which in turn is soluble and forms chloroplatinous acid ($H_2PtCl_4$).

$$Pt^{4+}(aq) + 6Cl^-(aq) \rightarrow PtCl_6^{2-}(aq) \qquad \text{Formula I}$$

However, Pt-residuals may still be found on the wafer during processing of the nickel-platinum silicide (NiPtSi) contact electrodes, particularly in high volume manufacturing. The root cause for the residuals includes incomplete stripping of the platinum, a chemistry change, the chemical concentration, environmental conditions, tools, etc., of which some factors are not controllable. Such residuals can cause contact to contact or contact to gate shorts. Although it has been found that application of SPM at high temperatures, such as greater than 160° C., dissolves Pt-residuals, this is costly, may damage the underlying layers of NiPtSi contact electrodes, titanium nitride (TiN) high-k metal gate, silicon nitride ($Si_3N_4$) spacers, and silicon dioxide ($SiO_2$) field oxide, and, therefore, is ineffective for high volume manufacturing.

A need therefore exists for methodology enabling a rework procedure to remove Pt-residuals from NiPtSi contact electrodes, without damaging underlying layers and while maintaining a high through-put.

SUMMARY

An aspect of the present disclosure is a method of forming Pt-containing NiSi including a rework with SPM on a single wafer clean (SWC) tool.

Another aspect of the present disclosure is semiconductor device including Pt-containing NiSi formed by including a rework with SPM on a SWC tool after removing unreacted Pt.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: depositing a layer of Ni/Pt on a semiconductor substrate; annealing the deposited Ni/Pt layer; removing unreacted Ni from the annealed Ni/Pt layer; annealing the Ni removed Ni/Pt layer; removing unreacted Pt from the annealed Ni stripped Ni/Pt layer; analyzing the Pt removed Ni/Pt layer for unreacted Pt residue; and if unreacted Pt residue is detected, applying SPM to the Pt removed Ni/Pt layer in a SWC tool.

Aspects of the present disclosure include applying SPM to the Pt removed Ni/Pt layer at a temperature of 130° C. Further aspects include applying SPM to the Pt removed Ni/Pt layer for 90 to 120 seconds. Other aspects include removing unreacted Pt by applying Aqua Regia. Further aspects include removing unreacted Ni with SPM, as at a temperature greater than or equal to 120° C. Additional aspects include precleaning the substrate with an ammonia and peroxide mixture (APM) or with diluted hydrofluoric acid (dHF). Further aspects include annealing the Ni/Pt layer by performing a first RTA, such as at a temperature of 260° C. to 330° C., and annealing the Ni removed Ni/Pt layer by performing a second RTA, as at a temperature greater than the temperature of the first RTA. Other aspects include forming gate electrodes on the semiconductor substrate; forming spacers on each side of the gate electrodes; and depositing the Ni/Pt layer between the spacers.

Another aspect of the present disclosure is a device including: a semiconductor substrate; gate electrodes on the semiconductor substrate; spacers on each side of each gate electrode; and Pt-containing NiSi on the substrate adjacent each spacer, wherein the Pt-containing NiSi is formed by: depositing a layer of Ni/Pt on the semiconductor substrate; performing a first RTA on the deposited Ni/Pt layer; removing unreacted Ni from the annealed Ni/Pt layer; performing a second RTA on the Ni removed Ni/Pt layer; removing unreacted Pt from the annealed Ni removed Ni/Pt layer; detecting unreacted Pt residue on the Pt removed Ni/Pt layer; and applying SPM on a SWC tool to remove the detected unreacted Pt residue.

Aspects include a device formed by the unreacted Pt being removed by applying Aqua Regia, and the unreacted Ni being removed with SPM at a temperature greater than or equal to 120° C. Other aspects include a device formed by the SPM being applied to the Pt removed Ni/Pt layer for 90 to 120 seconds. Further aspects include the SPM being applied to the Pt removed Ni/Pt layer at a temperature of 130° C.

Another aspect of the present disclosure is a method including: sputter depositing a layer of Ni/Pt from a Ni/Pt target on each wafer of a wafer lot; annealing the deposited Ni/Pt layer on each wafer; wet stripping unreacted Ni from the annealed Ni/Pt layer on each wafer; annealing the Ni stripped Ni/Pt layer on each wafer; stripping unreacted Pt from the annealed Ni stripped Ni/Pt layer on each wafer; obtaining a random sample of the Pt stripped wafers from the wafer lot; analyzing the random sample of wafers for Pt residue on the Pt stripped Ni/Pt layer; and applying SPM to the Pt stripped Ni/Pt layer at a temperature of 130° C. in a SWC tool for each wafer of the wafer lot, if Pt residue is detected on the wafers of the random sample.

Aspects include applying SPM to each Pt sripped Ni/Pt layer at a temperature of 130° C. Further aspects include applying SPM to each Pt sripped Ni/Pt layer for 90 to 120 seconds. Further aspects include stripping unreacted Pt by applying Aqua Regia. Other aspects include wet stripping unreacted Ni with SPM at a temperature greater than or equal to 120° C. Another aspect includes precleaning each wafer with APM or with dHF. Additional aspects include annealing the deposited Ni/Pt layer by performing a first RTA at 260° C. to 330° C., and annealing the Ni stripped Ni/Pt layer by performing a second RTA at a temperature greater than the temperature of the first RTA.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of platinum residuals attendant upon forming NiPtSi. In accordance with embodiments of the present disclosure, after the conventional Pt strip, if Pt residuals are detected, a rework is performed with SPM on a SWC tool.

Methodology in accordance with embodiments of the present disclosure includes depositing a layer of Ni/Pt on a semiconductor substrate, and annealing the deposited Ni/Pt layer. Unreacted Ni is then removed from the annealed Ni/Pt layer, such as by wet stripping the Ni, and the Ni stripped Ni/Pt layer is annealed again. Unreacted Pt is then removed from the annealed Ni stripped Ni/Pt layer, for example by stripping. The Pt stripped Ni/Pt layer is then analyzed for unreacted Pt residue, and if unreacted Pt residue is detected, SPM is applied to the Pt stripped Ni/Pt layer in a SWC tool, for example at a temperature of 130° C.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
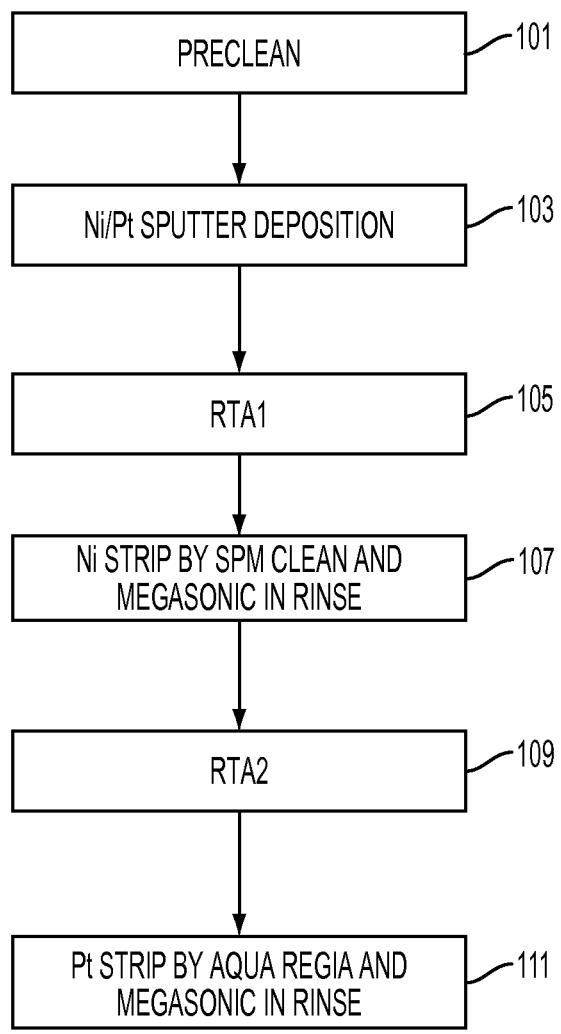
FIG. 1 illustrates a current process flow for forming NiPtSi in a semiconductor device.
Figure 2:
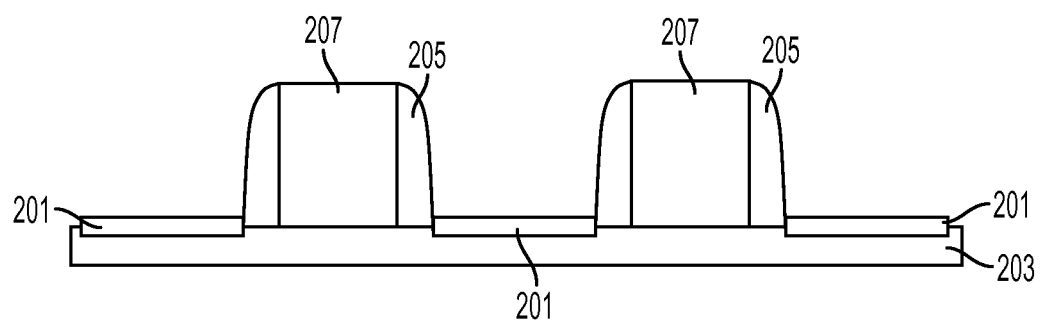
FIG. 2 schematically illustrates a semiconductor device including NiPtSi.

FIG. 1 illustrates a conventional process flow for forming NiPtSi 201 in a semiconductor device such as that illustrated in FIG. 2, particularly for 32 nm technologies. Substrate 203 is precleaned, for example with dilute hydrofluoric acid (dHF) or with a mixture of ammonia and peroxide (APM), as shown at step 101. As illustrated at step 103, Ni with 10% Pt is sputter deposited over the entire substrate 203, and a first RTA is performed (step 105). Adverting to step 107, unreacted Ni (Ni that is not on Si) is stripped by an SPM clean. Then, a second RTA is performed, as shown at step 109. In step 111, unreacted Pt is stripped by applying Aqua Regia. Spacers 205 (formed at each side of a gate electrode 207) may then be etched and shaped.

Figure 3:
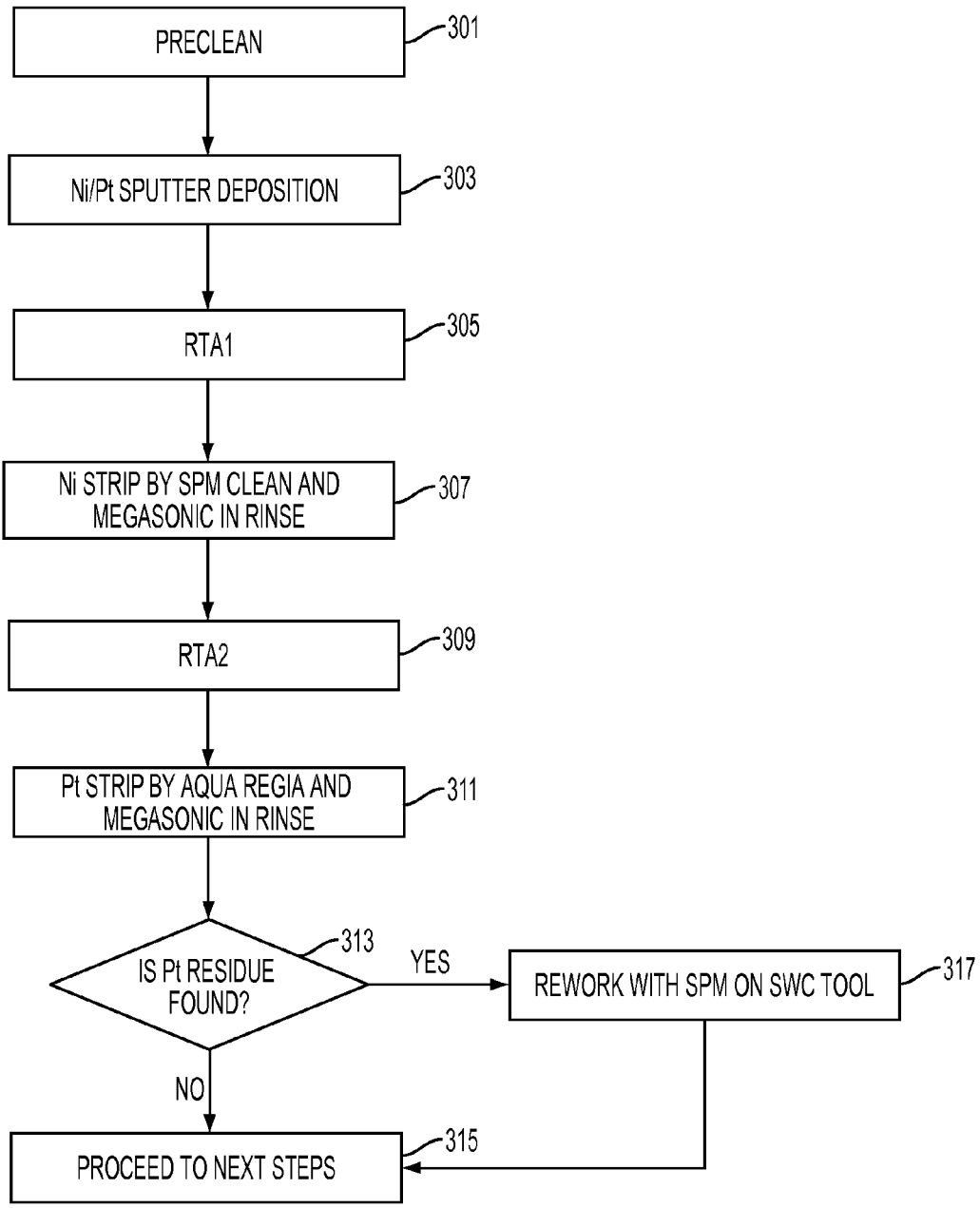
FIG. 3 illustrates a process flow for forming NiPtSi in a semiconductor device, in accordance with an exemplary embodiment.

As illustrated in FIG. 3, a process flow for forming NiSi 201 in a semiconductor device such as that shown in FIG. 2, in accordance with embodiments of the present disclosure. The initial process flow is similar to that of the process flow illustrated in FIG. 1. Adverting to step 301, substrate 203 is precleaned by applying dHF or APM. Then, Ni with 10% Pt is sputter deposited over the entire substrate 203, such as by physical vapor deposition (PVD), in step 303. A first RTA is subsequently performed at 260° C. to 330° C. (step 305).

Adverting to step 307, unreacted Ni is stripped by applying SPM having a 5 to 1 ratio for 5 to 12 minutes, e.g. 10 minutes, at a temperature greater than or equal to 120° C. and enhanced by megasonic agitation during the rinse. A second RTA, at a temperature greater than that for the first RTA, for example 450° C., is then performed in step 309.

As shown at step 311, unreacted Pt is stripped by applying Aqua Regia, at 40° C. for 8 to 12 minutes. Like the Ni strip, the Pt strip is enhanced by megasonic agitation during the rinse.

Adverting to 313, a random sampling, for example 3 wafers per lot, is then checked for Pt residue. If no Pt residue is detected, conventional processes continue for each wafer in the lot at step 315. If, however, Pt residue is detected, a rework is performed at step 317 for the entire lot rather than discarding the defective lot. Specifically, SPM is applied for each wafer at 130° C. for 90 to 120 seconds, in an SWC tool. The wafers may then be forwarded for further processing at step 315.

Figure 4A:
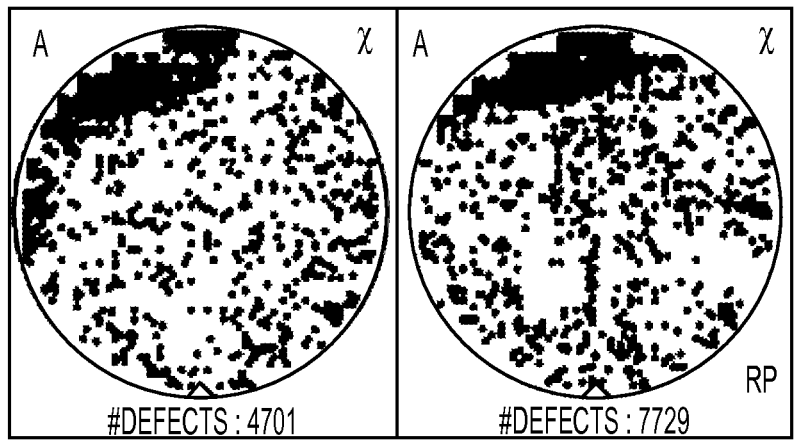
FIGS. 4A and 4B illustrate experimental data before and after rework, respectively, in accordance with an exemplary embodiment.
Figure 4B:
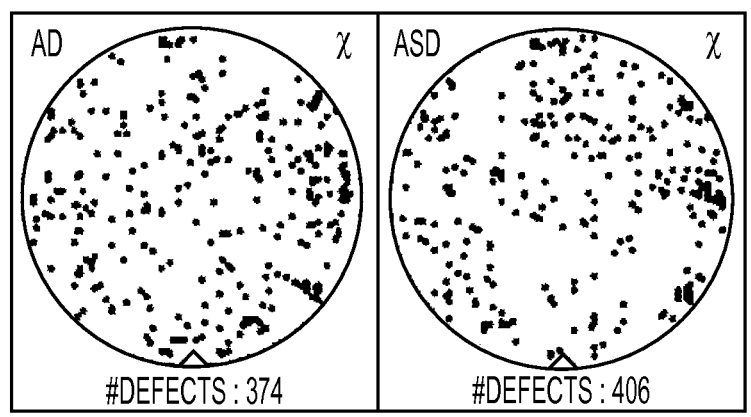

FIGS. 4A and 4B illustrate inline defect data before and after rework, respectively. As shown by the experimental data, the number of defects is reduced by more than a factor of ten, and no Pt residuals are found after the rework.

The embodiments of the present disclosure can achieve several technical effects, including removal of Pt residues on all wafers without damaging underlying layers, while maintaining high yield. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices that include a NiSi module, especially for 32 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
depositing a layer of nickel (Ni)/platinum (Pt) on a semiconductor substrate;
annealing the deposited Ni/Pt layer;
removing unreacted Ni from the annealed Ni/Pt layer;
annealing the Ni stripped Ni/Pt layer;
removing unreacted Pt from the annealed Ni stripped Ni/Pt layer;
analyzing the Pt stripped Ni/Pt layer for unreacted Pt residue; and if unreacted Pt residue is detected,
applying a sulfuric acid-hydrogen peroxide mixture (SPM) to the Pt stripped Ni/Pt layer in a single wafer clean (SWC) tool.

2. The method according to claim 1, comprising applying SPM to the Pt sripped Ni/Pt layer at a temperature of 130° C.

3. The method according to claim 2, comprising applying SPM to the Pt sripped Ni/Pt layer for 90 to 120 seconds.

4. The method according to claim 3, comprising removing unreacted Pt by applying Aqua Regia.

5. The method according to claim 3, comprising removing Ni with SPM at a temperature greater than or equal to 120° C.

6. The method according to claim 3, further comprising precleaning the substrate with an ammonia and peroxide mixture (APM) or with diluted hydrofluoric acid (dHF).

7. The method according to claim 3, comprising annealing the Ni/Pt layer by performing a first rapid thermal anneal (RTA) and annealing the Ni stripped Ni/Pt layer by performing a second RTA.

8. The method according to claim 7, comprising performing the first RTA at 260° C. to 330° C. and the second RTA at a temperature greater than the temperature of the first RTA.

9. The method according to claim 1, further comprising:
forming gate electrodes on the semiconductor substrate;
forming spacers on each side of the gate electrodes; and
depositing the Ni/Pt layer between the spacers.

10. A device comprising:
a semiconductor substrate;
gate electrodes on the semiconductor substrate;
spacers on each side of each gate electrode; and
platinum (Pt)-containing nickel silicide (NiSi) on the substrate adjacent each spacer, wherein the Pt-containing NiSi is formed by:
depositing a layer of nickel (Ni)/platinum (Pt) on the semiconductor substrate;
performing a first RTA on the deposited Ni/Pt layer;
removing unreacted Ni from the annealed Ni/Pt layer;
performing a second RTA on the Ni stripped Ni/Pt layer;
removing unreacted Pt from the annealed Ni stripped Ni/Pt layer;
detecting unreacted Pt residue on the Pt stripped Ni/Pt layer; and
applying SPM at 130° C. on a single wafer clean (SWC) tool to remove the detected unreacted Pt residue.

11. The device according to claim 10, wherein:
the unreacted Pt is removed by applying Aqua Regia; and
unreacted Ni is removed with a sulfuric acid-hydrogen peroxide mixture (SPM) at a temperature greater than or equal to 120° C.

12. The device according to claim 10, wherein SPM is applied to the Pt sripped Ni/Pt layer for 90 to 120 seconds.

13. The device according to claim 12, wherein SPM is applied to the Pt sripped Ni/Pt layer at a temperature of 130° C.

14. A method comprising:
sputter depositing a layer of nickel (Ni)/platinum (Pt) from a Ni/Pt target on each wafer of a wafer lot;
annealing the deposited Ni/Pt layer on each wafer;
wet stripping unreacted Ni from the annealed Ni/Pt layer on each wafer;
annealing the Ni stripped Ni/Pt layer on each wafer;
stripping unreacted Pt from the annealed Ni stripped Ni/Pt layer on each wafer;
obtaining a random sample of the Pt stripped wafers from the wafer lot;
analyzing the random sample of wafers for Pt residue on the Pt stripped Ni/Pt layer; and if Pt residue is detected on the wafers of the random sample,
applying a sulfuric acid-hydrogen peroxide mixture (SPM) to the Pt stripped Ni/Pt layer in a single wafer clean (SWC) tool for each wafer of the wafer lot.

15. The method according to claim 14, comprising applying SPM to each Pt sripped Ni/Pt layer at a temperature of 130° C.

16. The method according to claim 15, comprising applying SPM to each Pt sripped Ni/Pt layer for 90 to 120 seconds.

17. The method according to claim 16, comprising stripping unreacted Pt by applying Aqua Regia.

18. The method according to claim 16, comprising removing unreacted Ni with SPM at a temperature greater than or equal to 120° C.

19. The method according to claim 16, further comprising precleaning each wafer with an ammonia and peroxide mixture (APM) or with diluted hydrofluoric acid (dHF).

20. The method according to claim 16, comprising annealing the deposited Ni/Pt layer by performing a first rapid thermal anneal (RTA) at 260° C. to 330° C., and annealing the Ni stripped Ni/Pt layer by performing a second RTA at a temperature greater than the temperature of the first RTA.

* * * * *